(12) United States Patent
Zhu et al.

(10) Patent No.: US 11,978,506 B2
(45) Date of Patent: May 7, 2024

(54) SPATIAL LIGHT MODULATOR

(71) Applicant: AGENCY FOR SCIENCE, TECHNOLOGY AND RESEARCH, Singapore (SG)

(72) Inventors: Di Zhu, Singapore (SG); Kevin Tshun Chuan Chai, Singapore (SG); Aarthy Mani, Singapore (SG); Anh Tuan Do, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 18/039,414

(22) PCT Filed: Dec. 10, 2020

(86) PCT No.: PCT/SG2020/050737
§ 371 (c)(1),
(2) Date: May 30, 2023

(87) PCT Pub. No.: WO2022/124976
PCT Pub. Date: Jun. 16, 2022

(65) Prior Publication Data
US 2024/0005984 A1 Jan. 4, 2024

(51) Int. Cl.
*G11C 11/418* (2006.01)
*G02F 1/133* (2006.01)
(Continued)

(52) U.S. Cl.
CPC ........ *G11C 11/418* (2013.01); *G02F 1/13306* (2013.01); *G02F 1/13439* (2013.01); *G02F 1/1368* (2013.01); *G09G 3/3648* (2013.01); *G02F 2203/12* (2013.01); *G09G 2300/0857* (2013.01); *G09G 2310/08* (2013.01)

(58) Field of Classification Search
CPC .............. G11C 11/418; G02F 1/13306; G02F 1/13439; G02F 1/1368; G02F 2203/12; G09G 3/3648; G09G 2300/0857; G09G 2310/08
See application file for complete search history.

(56) References Cited

U.S. PATENT DOCUMENTS

| 6,144,356 | A | 11/2000 | Weatherford et al. |
| 6,239,779 | B1 | 5/2001 | Furuya et al. |

(Continued)

OTHER PUBLICATIONS

International Search Report of International Application No. PCT/SG2020/050737 dated Apr. 4, 2021.

*Primary Examiner* — Jonathan A Boyd
(74) *Attorney, Agent, or Firm* — Burns & Levinson LLP; Steven M. Mills

(57) ABSTRACT

This document describes a spatial light modulator that comprises a pixel array having a plurality of pixels whereby each pixel in this array is communicatively coupled to a digital pixel circuit which are in turn all coupled to a bit-plane control circuit. The bit-plane control circuit is configured to generate, using a Pulse Code Modulation (PCM) algorithm, bit-plane signals that are used to control the sample and hold functions performed by each of the digital pixel circuits so that the pixel array may carry out its scanning function accurately and in a power efficient manner.

16 Claims, 3 Drawing Sheets

(51) Int. Cl.
*G02F 1/1343* (2006.01)
*G02F 1/1368* (2006.01)
*G09G 3/36* (2006.01)

(56) References Cited

U.S. PATENT DOCUMENTS

2004/0156246 A1* 8/2004 Nakamura ............ G09G 3/3611
                                                    365/199
2016/0300552 A1* 10/2016 Iwasa .................... G09G 3/2022

* cited by examiner

SPATIAL LIGHT MODULATOR

CROSS-REFERENCE TO RELATED APPLICATIONS

This application is a National Stage Application, filed under 35 U.S.C. § 371, of International Application No. PCT/SG2020/050737, filed Dec. 10, 2020, which is incorporated herein by reference in its entirety.

FIELD OF THE INVENTION

This invention relates to a spatial light modulator that comprises a pixel array having a plurality of pixels whereby each pixel in this array is communicatively coupled to a digital pixel circuit which are in turn all coupled to a bit-plane control circuit. The bit-plane control circuit is configured to generate, using a Pulse Code Modulation (PCM) algorithm, bit-plane signals that are used to control the sample and hold functions performed by each of the digital pixel circuits so that the pixel array may carry out its scanning function accurately and in a power efficient manner.

SUMMARY OF THE PRIOR ART

A Spatial Light Modulator (SLM) is an electronic device that is used to modulate amplitude, phase, and/or polarization of light waves in space and time. Phase-only SLMs are commonly used in adaptive focus depth devices and/or holographic 3D displays that are found in near-eye augmented reality (AR) glasses, automotive heads-up displays (HUDs), holotables/boxes, or focal surface virtual reality (VR) head-mounted displays (HMDs).

Currently, most of the fast response time SLM-based systems utilize optical microelectromechanical systems (MEMS) or Liquid Crystal Display (LCD) techniques. Due to the binary phase modulation utilized by the MEMS systems, the quality of the reconstructed image is compromised due to the occurrence of significant quantization noise. As a result, liquid crystal based technology has been widely adopted as it provides a good balance between the modulation of light intensity, phase, polarization rotation, and electrically controlled birefringence (ECB) of the signals that are to be displayed. This technology also allows a large number of pixels to be provided on a small display panel due to the use of a silicon backplane.

In conventional LCD systems, high driving voltages are usually required due to the low electron mobility of Thin Film Transistors (TFT), which are typically in the range between 0.2 and 1.5 $cm^2/Vs$ for TFTs. As a reference, the mobility of Complementary Metal Oxide Semiconductor (CMOS) transistors are usually between 10 and 50 $cm^2/Vs$. However, in order to achieve the required phase modulation of the driving signals, the thickness of the liquid crystal layer has to be double the thickness of a liquid crystal layer that is designed to achieve the required amplitude modulation of the driving signals.

Those skilled in the art have also proposed the use of pixel circuits that are each coupled to a pixel in the pixel array whereby each pixel circuit comprises a Dynamic Random Access Memory (DRAM) circuit that is coupled to a capacitor. The downside of such a DRAM-based circuit is that it is sensitive to charge leakage as such, large capacitors are usually utilized to supress the influence of charge leakage, thereby increasing the overall size of the circuit.

For those above reasons, those skilled in the art are constantly trying to implement CMOS driving schemes that do not require a thick liquid crystal layer and do not require pixel arrays with overly large sizes.

SUMMARY OF THE INVENTION

The above and other problems are solved and an advance in the art is made by systems and methods provided by embodiments in accordance with the invention.

A first advantage of embodiments of a spatial light modulator and a method for modulating spatial light in accordance with the invention is that the pixel array is small in size and does not require large areas on an integrated circuit (IC) chip.

A second advantage of embodiments of a spatial light modulator and a method for modulating spatial light in accordance with the invention is that modulator consumes less power due to its lower clock frequency.

A third advantage of embodiments of a spatial light modulator and a method for modulating spatial light in accordance with the invention is a voltage driver circuit used to drive a voltage at the top plate of the liquid crystal layer of the pixel array may be integrated into the modulator thereby saving space on the IC chip.

A fourth advantage of embodiments of a spatial light modulator and a method for modulating spatial light in accordance with the invention is that the modulator does not require the use of a complicated Digital-to-Analog converter array thereby reducing the overall size of the modulator and reducing the overall power consumption of the system.

The above advantages are provided by embodiments of a modulator or a method of using the modulator in accordance with the invention operating in the following manner.

According to a first aspect of the invention, a spatial light modulator is disclosed, the spatial light modulator comprising: a pixel array having a plurality of pixels whereby each pixel is communicatively connected to a digital pixel circuit whereby each digital pixel circuit comprises: a Static Random Access Memory (SRAM) circuit configured to receive column data signals and a clock row enable signal, ck_row, whereby the SRAM circuit is triggered by the clock row enable signal, ck_row, to sample the received column data signals; a hold buffer circuit coupled to an output of the SRAM circuit, the hold buffer circuit configured to receive a clock hold signal, ck_hold, whereby the hold buffer circuit is triggered by the clock hold signal, ck_hold, to receive and store the sampled signal from the output of the SRAM circuit.

With regard to the first aspect of the invention, the spatial light modulator further comprises a bit-plane control circuit communicatively connected to all the digital pixel circuits, the bit-plane control circuit being configured to: generate, using a pulse code modulation (PCM) scheme, bit-plane signals, whereby each bit-plane signal comprises a variable holding time component for triggering the hold buffer circuit in each of the digital pixel circuits for a variable time period $T_{Hold\_N}$, and a predetermined addressing time component for triggering the SRAM circuit in each of the digital pixel circuits for a predetermined time period $T_{Add}$.

With regard to the first aspect of the invention, the addressing time component is predetermined based on a unit duration of a Least Significant Bit (LSB) of a bit-plane signal and a pixel multiplier, $\alpha_P$ wherein the pixel multiplier, $\alpha_P$ is based on numbers of rows and columns, and data input-output ports of the pixel array.

With regard to the first aspect of the invention, the pixel multiplier, $\alpha_p$, is defined as $$\alpha_p = \frac{(\text{Number of rows}) \times (\text{Number of columns})}{(\text{Number of data input/output ports})}$$

With regard to the first aspect of the invention, each pixel in the pixel array comprises a liquid crystal layer provided between an indium tin oxide (ITO) electrode and a pixel electrode, whereby the ITO electrode is configured to receive an alternating voltage and the pixel electrode is connected to an output of the digital pixel circuit.

With regard to the first aspect of the invention, each pixel in the pixel array comprises a liquid crystal layer provided between an indium tin oxide (ITO) electrode and a pixel electrode, whereby the pixel electrode is connected to an output of the digital pixel circuit and the ITO electrode is configured to receive an alternating voltage from the bit-plane control circuit, whereby the alternating voltage is synchronized with an output signal at the output of the digital pixel circuit.

With regard to the first aspect of the invention, the spatial light modulator according to claim 1 whereby the hold buffer circuit comprises: a first and a third transistor having input gates coupled to the output of the SRAM circuit; a second and a fourth transistor having input gates configured to receive a clock hold signal, ck_hold, whereby a drain node of the second transistor is coupled to a source node of the first and third transistors.

With regard to the first aspect of the invention, a transistor of the hold buffer circuit is shared between two or more digital pixel circuits.

According to a second aspect of the invention, a method for modulating spatial light using a spatial light modulator that has a pixel array which comprises a plurality of pixels whereby each pixel is communicatively connected to a digital pixel circuit is disclosed, the method comprising receiving, using a Static Random Access Memory (SRAM) circuit provided within each digital pixel circuit, column data signals and a clock row enable signal, ck_row, whereby the SRAM circuit is triggered by the clock row enable signal, ck_row, to sample the received column data signals; receiving, using a hold buffer circuit coupled to an output of the SRAM circuit, a clock hold signal, ck_hold, whereby the hold buffer circuit is triggered by the clock hold signal, ck_hold, to receive and store the sampled signal from the output of the SRAM circuit.

With regard to a second aspect of the invention, the method further comprises the step of generating, using a bit-plane control circuit communicatively connected to all the digital pixel circuits, bit-plane signals based on a pulse code modulation (PCM) scheme, whereby each bit-plane signal comprises a variable holding time component for triggering the hold buffer circuit in each of the digital pixel circuits for a variable time period $T_{Hold\_N}$, and a predetermined addressing time component for triggering the SRAM circuit in each of the digital pixel circuits for a predetermined time period $T_{Add}$.

With regard to a second aspect of the invention, the addressing time component is predetermined based on a unit duration of a Least Significant Bit (LSB) of a bit-plane signal and a pixel multiplier, $\alpha_P$ wherein the pixel multiplier, $\alpha_P$ is based on numbers of rows and columns, and data input-output ports of the pixel array.

With regard to a second aspect of the invention, the pixel multiplier, $\alpha_p$, is defined as $$\alpha_p = \frac{(\text{Number of rows}) \times (\text{Number of columns})}{(\text{Number of data input/output ports})}$$

With regard to a second aspect of the invention, each pixel in the pixel array comprises a liquid crystal layer provided between an indium tin oxide (ITO) electrode and a pixel electrode, whereby the ITO electrode is configured to receive an alternating voltage and the pixel electrode is connected to an output of the digital pixel circuit.

With regard to a second aspect of the invention, each pixel in the pixel array comprises a liquid crystal layer provided between an indium tin oxide (ITO) electrode and a pixel electrode, whereby the pixel electrode is connected to an output of the digital pixel circuit and the ITO electrode is configured to receive an alternating voltage from the bit-plane control circuit, whereby the alternating voltage is synchronized with an output signal at the output of the digital pixel circuit.

With regard to a second aspect of the invention, the hold buffer circuit comprises: a first and a third transistor having input gates coupled to the output of the SRAM circuit; a second and a fourth transistor having input gates configured to receive a clock hold signal, ck_hold, whereby a drain node of the second transistor is coupled to a source node of the first and third transistors.

With regard to a second aspect of the invention, a transistor of the hold buffer circuit is shared between two or more digital pixel circuits.

BRIEF DESCRIPTION OF THE DRAWINGS

The above advantages and features in accordance with this invention are described in the following detailed description and are shown in the following drawings.

DETAILED DESCRIPTION

This invention relates to a spatial light modulator that comprises a pixel array having a plurality of pixels whereby each pixel in this array is communicatively coupled to a digital pixel circuit which are in turn all coupled to a bit-plane control circuit. Each digital pixel circuit comprises a Static Random Access Memory (SRAM) circuit coupled to a hold buffer circuit. The SRAM circuit is configured to sample received signals when triggered with an appropriate clock signal and the hold buffer circuit is configured to receive and hold the sampled signal from the SRAM circuit when triggered with another appropriate clock signal.

The bit-plane control circuit is configured to generate, using a Pulse Code Modulation (PCM) algorithm, bit-plane signals that are used to trigger the sample and hold functions performed by each of the digital pixel circuits so that the pixel array may carry out its scanning function accurately and in a power efficient manner.

Figure 1:
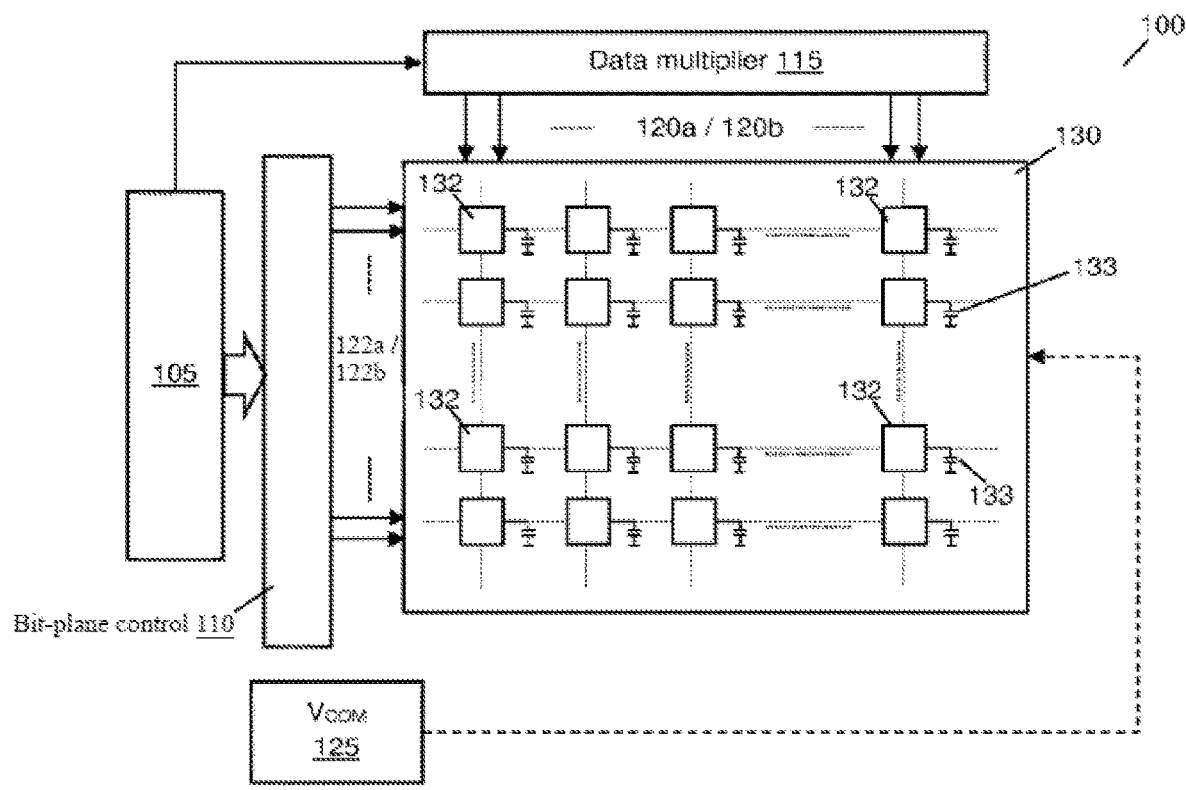
FIG. 1 illustrating a block diagram of a spatial light modulator system in accordance with embodiments of the invention.

FIG. 1 illustrates a block diagram of a spatial light modulator (SLM) system in accordance with embodiments of the invention. SLM system 100 in general comprises controller 105 which is configured to control the signals generated by data multiplier 115 and bit-plane control circuit 110, and pixel array 130 which comprises a plurality of digital pixel circuits 132 that are each in turn connected to liquid crystal (LC) layer 133. Pixel array 130 is the most important block in SLM system 100, as its performance influences the system's optical response directly. In embodiments of the invention, digital pixel circuits 132 are SRAM-based thereby negating the need for large holding capacitors as those used in Dynamic Random Access Memory (DRAM)-based pixel circuit designs, which make such digital pixel circuits 132 compact and suitable for process scaling.

As illustrated in FIG. 1, pixel array 130 is configured to receive data and/or information from data multiplier 115 and bit-place control circuit 110. In particular, data multiplier 115 is configured to provide a plurality of column data signal pairs 120a and 120b to the plurality of pixel circuits 132 in pixel array 130. As for bit-plane control circuit 110, this circuit is configured to provide bit-plane signals 122a/122b that are generated using a Pulse Code Modulation (PCM) algorithm to the plurality of pixel circuits 132 to control the sample and hold functions performed by each of pixel circuits 132.

In embodiments of the invention, controller 105 may comprise a state machine, counters, data registers, decoders, a deserializer, a clock generator, driving circuits, memories and all other modules required by a controller to perform functions known in the art. The exact operation and workings of controller 105 is omitted for brevity as its functions and internal modules/circuits are known to those skilled in the art.

In conventional SLM systems, the driving voltages used to drive pixel circuits 132 are usually greater than 5 volts. As such, there exists a trade-off between the power consumption of the modules in the SLM system and the system's driving ability (e.g. the LC layer's settling time, etc.) of the pixel circuits. In other words, when pixel circuits 132 are driven with a high voltage, this boosts the switching speed of the liquid crystal layer, but negatively causes an increase in power dissipation of the driving circuits. As such, in view of the above trade-off, level shifters (not shown) are included in SLM system 100 to accommodate the supply voltage difference between the voltage used by controller 105 and the voltages used to drive pixel circuits 132 in pixel array 130. For example, when standard 40 nm CMOS processes are employed, the typical digital voltage $V_{DD}$ of controller 105 would be around 1.1 volts. As such, when the voltage threshold of the liquid crystal layer is greater than 3 volts (e.g. for typical twisted nematic effect (TN-effect) liquid crystal layers), the level shifters would be employed to convert the driving signals (which are at 1.1. volts) as received from controller 105 to 5 volts.

In embodiments of the invention, SLM system 100 may also include voltage driver $V_{COM}$ circuit 125 which is configured to generate and provide an alternating voltage to a top layer of the liquid crystal display in pixel array 130. Voltage driver circuit 125 is used to implement field inversion at the liquid crystal layer of pixel array 130 (this is also known as DC balancing), and this is done to prevent the unidirectional flow of ions in the liquid crystal layer. When unidirectional flow of ions occur in the LC layer, a constant charge may be built at the surface of the LC layer and consequently, cause electrolytic degradation of the liquid crystal mixture and affect the modulating properties of pixel array 130. The use of the alternating voltage generated by voltage driver circuit 125 effectively prevents this from happening.

In operation, each row of pixels in pixel array 130 may be addressed by one "word-line" (WL) (e.g. comprising bit-plane signals 122a/122b) and each column of pixels in pixel array 130 may be addressed by a pair of bit-lines (BLs) (i.e. column data signal pairs 120a/120b). As all the pixels in a row are selected and written sequentially, in order to synchronize the addressing of these pixels, all column data that is to be sampled by these pixels should be refreshed every system clock cycle whereby each row of pixels are also addressed based on the same system clock. After all the rows are addressed, pixel array 130 will then be flashed (illuminated), and the flashing of pixel array 130 is controlled by bit-plane signals 122a/122b as generated by bit-plane control circuit 110.

Figure 2:
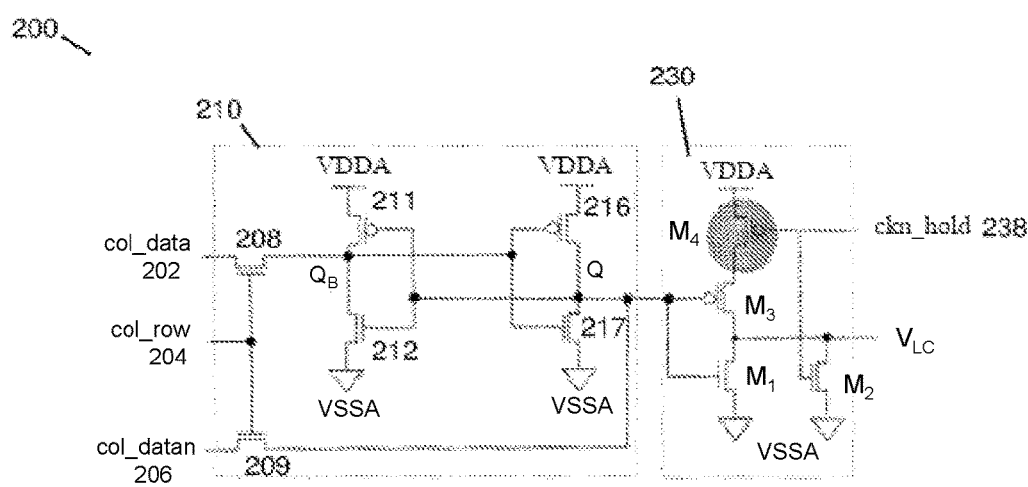
FIG. 2 illustrating a circuit diagram of a digital pixel circuit in accordance with embodiments of the invention.

FIG. 2 illustrates a digital pixel circuit 200, whereby each digital pixel circuit is communicatively coupled to a pixel in the pixel array to control the pixel in accordance with embodiments of the invention. In particular, digital pixel circuit 200 comprises a Static Random Access Memory (SRAM) circuit 210 and hold buffer circuit 230. SRAM circuit 210 comprises transistors 208, 209, 211, 212, 216, and 217, whereby the drain of transistors 211 and 216 are connected to a high voltage $V_{DDA}$ and the source of transistors 212 and 217 are connected to voltage $V_{SSA}$ that is relatively lower than the voltage $V_{DDA}$. One skilled in the art will recognize that these transistors may comprise Metal-Oxide-Semiconductor Field Effect Transistors (MOSFETs) or any other types of transistors without departing from the invention.

In embodiments of the invention, as illustrated in FIG. 2, transistors 211, 212, 216 and 217 are configured as two cross-coupled inverters. During normal operation of the SRAM circuit, transistors 208 and 209 act as access transistors, controlling the access to the "storage-transistors" 211, 212, 216 and 217. In particular, access to SRAM circuit 210 is enabled by the ck_row input port 204 which controls the access transistors 208 and 209. When these access transistors 208 and 209 are enabled, SRAM circuit 210 will sample signals from col_data input port 202 and col_datan input port 206 and the sampled signals will be stored at nodes $Q_B$ and Q respectively. Typically, the signal sampled at node $Q_B$ will be the inverse of the signal sampled at Q and this is done in order to improve noise margins.

Hold buffer circuit 230 comprises transistors M1, M2, M3 and M4. As illustrated in FIG. 2, the inputs to transistors M1 and M3 are coupled to node Q of SRAM circuit 210 while the inputs of transistors M2 and M4 are coupled to ckn_hold port 238. A drain node of the transistor M2 is coupled to a source node of transistors M1 and M3. This means that when ckn_hold port 238 is at a high voltage level, transistor M2 will be switched on and as a result, the output node $V_{LC}$ will be reset to ground, i.e. the pixel will be in a reset mode. Conversely, when ckn_hold port 238 is at a low voltage level, transistor M4 will be switched on and transistor M2 will be switched off. This causes the voltage level at node Q to be transferred to the output node $V_{LC}$ through transistors M1 and M3.

In operation, in a first phase, ck_row port 204 will receive a high voltage level thereby enabling the addressing function of circuit 200. When this happens, data signals provided at col_data port 202 and col_datan port 206 will be sampled by SRAM circuit 210. These sampled signals will be stored at nodes $Q_B$ and Q respectively. At this time, a high voltage level will be provided to ckn_hold port 238 ensuring that the voltage level at node $V_{LC}$ is reset to 'ground' by transistor $M_2$.

In a second phase, a low voltage level is provided to ck_row port 204 thereby disabling the addressing function of circuit 200. When a low voltage level is provided to ckn_hold port 238, circuit 200 will now be in its holding phase. When this happens, the sampled signal at node Q of SRAM circuit 210 will be transferred to hold buffer circuit 230 by transistor $M_3$ and depending on the sampled signal at node Q, the voltage level at node $V_{LC}$ will be toggled high (from the ground state) or will remain low.

Additionally, as highlighted by a circle, transistor $M_4$ is different from the other transistors in hold buffer circuit 230. As the source of $M_4$ is always connected to a high voltage $V_{DDA}$, and as the gate of $M_4$ is controlled by ckn_hold, transistor $M_4$ can be shared by two or more digital pixel circuits 200. This means that in certain embodiments of the invention, two adjacent pixels may share a single transistor $M_4$ thereby reducing the number of transistors required and thus the IC layout area of the pixel array. The sharing of transistor $M_4$ between two or more digital pixel circuits also reduces the overall power consumption of the pixel array due to the reduced switching load applied to ckn_hold port 238 and also reduces the amount of surge current drawn from the voltage source $V_{DDA}$ when the ckn_hold voltage transients from high-to-low.

For example, in embodiments of the invention, each digital pixel circuit may only require 9.5 transistors, two data pins, and two clock pins thereby simplifying the design of the circuit and reducing the layout area of all the digital pixel circuits in the pixel array.

Generation of Bit-Plane Signal Using Pulse Code Modulation (PCM) Algorithm

In embodiments of the invention, when an alternating current (AC) driving voltage is applied to the liquid crystal (LC) layer of the pixel array through the pixel circuits, the response of the LC layer is dependent on the root-mean-square (RMS) voltage of the signals provided to the pixel circuit. As known to those skilled in the art, when the pulse width is controlled, i.e. when the duty-cycle value of a square wave signal is controlled, the equivalent RMS value of the signal will be related to the square root of the duty-cycle as given by equation (1) below.

$$V_{RMS} = V_{PP} \times \sqrt{\text{Duty\_cycle}} \quad \text{Equation (1)}$$

where $V_{PP}$ is the peak-to-peak voltage of the applied square wave (which is $V_{DDA}$ as illustrated in FIG. 2), and the duty-cycle value comprises a percentage value. For example, in order to achieve a $V_{RMS}$ of $0.5 \ast V_{PP}$, the duty cycle of the modulated pulses should be 25%.

Additionally, the equivalent RMS value of the signal may be defined by equations (2a)-(2d) as derived below:

$$T = 2^N T_u \quad \text{Equation (2a)}$$

$$T_D = \sum_{i=0}^{N-1} A_i 2^i T_u = n T_u \quad \text{Equation (2b)}$$

$$P_{RMS} = \frac{1}{T} \int_0^{T_D} V_{PP}^2 dt = V_{PP}^2 \times \frac{T_D}{T} \quad \text{Equation (2c)}$$

$$V_{RMS} = V_{PP} \times \sqrt{\frac{T_D}{T}} = V_{PP} \times \sqrt{\frac{n}{2^N}} \quad \text{Equation (2d)}$$

where T is the total duration of a complete frame, N is the total number of bit-plane signals, $A_i$ is the signal-dependent coefficient of each bit-plane, $T_D$ is the duration of a high voltage level in every frame cycle, $T_U$ is the unit duration (i.e. the least significant bit (LSB)) of $V_{PP}$, and n is the sum of all signal-dependent coefficients. In embodiments of the invention, when the total resolution of a grey scaled image is 8 bits, N would be equal to 256 ($2^8$), and the maximum pulse duration T corresponding to 256 is $256^2$, which equals to $(65536) \times T_U$.

When a PCM algorithm is used to generate conventional bit-plane signals for a pixel array, a sequence of bit-plane signals will be generated whereby the pulse duration of the first bit-plane signal will have a duration of $2^0 T_U$, the second bit-plane signal will have a duration of $2^1 T_U$ and so on until the $16^{th}$ bit-plane signal has a pulse duration of $2^{15} T_U$ (i.e. for a 16-bit bit-plane). As a result, it can been calculated that the total length of the 16-bit bit-plane signal is the sum of all the individual bit-plane pulse durations, which equal to $(65535) \times T_U$.

The generated bit-plane signals may then be used to control the illumination of the pixel array. When the first bit-plane signal having a pulse width $2^0 T_U$ is illuminated by the pixel array, the second bit-plane signal having a pulse width $2^1 T_U$ will be addressed or scanned by the pixel circuits. This means that the data relating to the second bit-plane signal will be transferred to each pixel and scanned row by row for the duration of the second bit-plane signal, e.g. $2^1 T_U$, until the whole pixel array is addressed.

At the next duration, the second bit-plane signal having a pulse width $2^1 T_U$ will be illuminated by the pixel array, and the third bit-plane signal having a pulse width $2^2 T_U$ will be addressed or scanned by the pixel circuits. This means that the data relating to the third bit-plane signal will be transferred to each pixel and scanned row by row for the duration of the third bit-plane signal, e.g. $2^2 T_U$, until the whole pixel array is addressed. This repeats until all the bit-plane signals (i.e. 16-bit bit-plane signals in the example above) have been addressed and illuminated by the pixel array.

For example, when a pixel array having 1024×768 pixels is utilized, the entire 1024 rows have to be scanned within a time duration of $2_0 T^U$, i.e. the pulse duration of the first bit-plane signal. Therefore, the shortest addressing time $T_{row}$ for each row has to be $T_U/1024$. If the frame rate is taken to be 60 hertz, the total addressing time $(65535 \times T_U)$ for a 8-bit grey level would equal to a quarter of $\frac{1}{60}$, which is 4.17 milliseconds. Hence, $T_U$ would equal to 63.6 nanoseconds, and $T_{row}$ would be 62.1 ps, corresponding to 16.1 GHz. As known to one skilled in the art, the power consumption of digital circuits are proportional to the frequency of the system's clock. As such, when the system's clock frequency is 16.1 GHz, this results in considerable power consumption which is not ideal.

Figure 3:
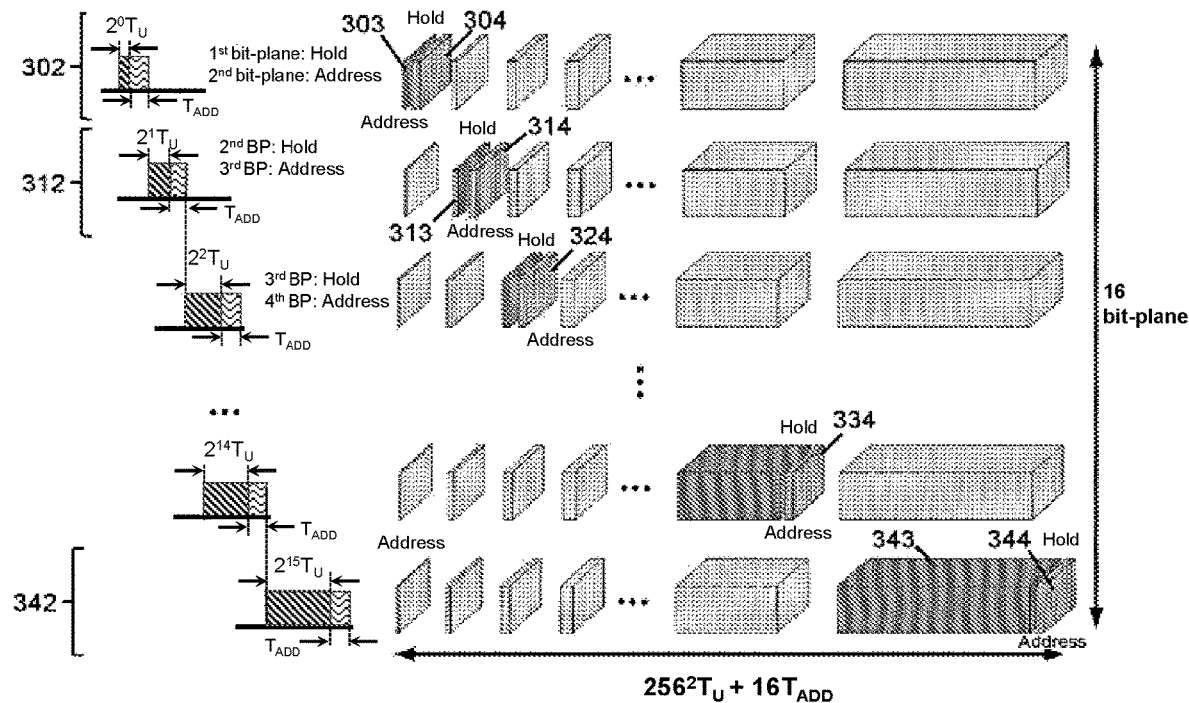
FIG. 3 illustrating bit-plane signals generated by a pulse code modulation (PCM) algorithm in accordance with embodiments of the invention.

In accordance with embodiments of the invention, the PCM algorithm is used to generate new bit-plane signals that are to be used together with digital pixel circuit 200 and the bit-plane signals generated are illustrated in FIG. 3. In order to have a system clock that has relatively low frequency, the PCM algorithm is used to generate bit-plane signals that have a fixed addressing time $T_{ADD}$. As a result, the total duration of a frame, $T_{frame}$, may be defined in equation (3) below.

$$T_{frame} = 2^{16}T_u + 16 \times T_{ADD} \qquad \text{Equation (3)}$$

Where it can be seen that in order to achieve a frame rate of 60 hertz, and if the fixed addressing time $T_{ADD}$ is set as (1000×$T_U$), the value of $T_U$ would be equal to 51.1 ns, i.e. 19.55 MHz. Therefore, it can be seen that when the addressing time is fixed, this greatly reduces the system's clock frequency.

As illustrated in FIG. 3, it can be seen that the addressing times for all the bit-plane signals are now fixed and this can be seen from pulse widths 304, 314, 324, 334, 344 which all employ fixed addressing time $T_{ADD}$.

At step 302, when the first bit-plane signal 303 having a pulse width $2^0T_U$ is held by digital pixel circuit 200 for illumination by the pixel array, the second bit-plane signal will be addressed or scanned by pixel circuits 200 for a fixed addressing time $T_{ADD}$, i.e. pulse width 304. This means that the data relating to the second bit-plane signal will be transferred to each pixel and scanned row by row for the duration of the fixed addressing time $T_{ADD}$ until the whole pixel array has been addressed.

At the next step 312, the second bit-plane signal 313 having a pulse width $2^1T_U$ will be illuminated by the pixel array, and the third bit-plane signal having a pulse width $2^2T_U$ will be addressed by pixel circuits 200 for a fixed addressing time $T_{ADD}$, i.e. pulse width 314. This means that the data relating to the second bit-plane signal will be transferred to each pixel and scanned row by row for the duration of the fixed addressing time $T_{ADD}$ until the whole pixel array has been addressed.

This repeats until all the bit-plane signals (i.e. 16-bit bit-plane signals as illustrated in FIG. 3) have been addressed and illuminated by the pixel array. At the final step, 342, it can be seen the 16$^{th}$ bit-plane signal 343 having a pulse width $2^{15}T_U$ will be illuminated by the pixel array, and the first bit-plane signal belonging to a new set of bit-plane signals having a pulse width $2^0T_U$ will be addressed by pixel circuits 200 for a fixed addressing time $T_{ADD}$, i.e. pulse width 344.

Figure 4:
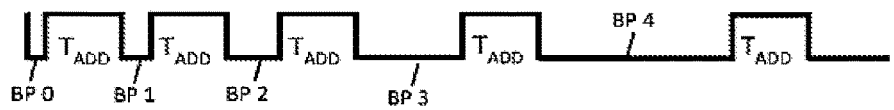
FIG. 4 illustrating a timing diagram of bit-plane signals generated by the PCM algorithm in accordance with embodiments of the invention.

The bit plane signals generated by the PCT algorithm may be summarized into a serial timing diagram as illustrated in FIG. 4 where each bit-plane signal comprises a variable holding time component that is used to trigger the hold buffer circuit in each of the digital pixel circuits for a variable time period "BP N" or $T_{Hold\_N}$, where "N" represents the number of the bit-plane signal, and a predetermined addressing time component for triggering the SRAM circuit in each of the digital pixel circuits for a predetermined time period $T_{ADD}$.

For the avoidance of doubt, the first bit-plane signal is made up of $T_{ADD}$ which represents the fixed address period and BP 0 which represents the pulse width $2^0T_U$ of the first bit-plane signal, the second bit-plane signal is made up of $T_{ADD}$ and BP 1 which represents the pulse width $2^1T_U$ of the second bit-plane signal, the third bit-plane signal is made up of $T_{ADD}$ and BP 2 which represents the pulse width $2^2T_U$ of the third bit-plane signal, the fourth bit-plane signal is made up of $T_{ADD}$ and BP 3 which represents the pulse width $2^3T_U$ of the fourth bit-plane signal, the fifth bit-plane signal is made up of $T_{ADD}$ and BP 4 which represents the pulse width $2^4T_U$ of the fifth bit-plane signal, and so on.

Example 1: Timing Calculation for a 768×1024 Pixel Array Having 32 Data Inputs/Outputs When the method of generating the bit-plane signals as illustrated in FIGS. 3 and 4 are used, the total duration of a frame $T_{frame}$ for a 768×1024 pixel array may be computed as follows. The total duration of a frame may be obtained by equation (3) as:

$$T_{frame} = 65535T_u + i \times T_{ADD}$$

If the system clock is 150 MHz, $T_U$ is 1/150 MHz=6.7 ns, where $T_{ADD}$ is $\alpha_P \times T_U$, where $\alpha_P$ is the pixel multiplier and may be defined as:

$$\alpha_p = \frac{\text{(Number of rows)} \times \text{(Number of columns)}}{\text{(Number of data input/output ports)}}$$

As a result, $T_{ADD} = 768 \times (1024/32) \times T_U = 24576 T_U$. Hence, $T_{frame} = 2^{16}T_u + 16 \times T_{ADD} = 65535T_u + 16 \times T_{ADD} = 458753T_u = 3.06$ ms. So the equivalent frame rate is found to be 163 Hz (2 sub-frame per frame) or 82 Hz (4 sub-frame per frame).

Example 2: Timing Calculation for a 480×640 Pixel Array Having 32 Data Inputs/Outputs When the method of generating the bit-plane signals as illustrated in FIGS. 3 and 4 are used, the total duration of a frame $T_{frame}$ for a 480×640 pixel array may be computed as follows. The total duration of a frame may be obtained by equation (3) as:

$$T_{frame} = 65535T_u + i \times T_{ADD}$$

If the system clock is 100 MHz, $T_U$ is 1/150 MHz=10 ns, where $T_{ADD}$ is $\alpha_P \times T_U$, and as a result, $T_{ADD} = 480 \times (640/32) \times T_U = 9600T_U = 96$ μs. Hence, $T_{frame} = 2^{16}T_u + 16 \times T_{ADD} = 219136T_u = 2.19$ ms. So the equivalent frame rate is found to be 228 Hz (2 sub-frame per frame) or 114 Hz (4 sub-frame per frame).

Figure 5:
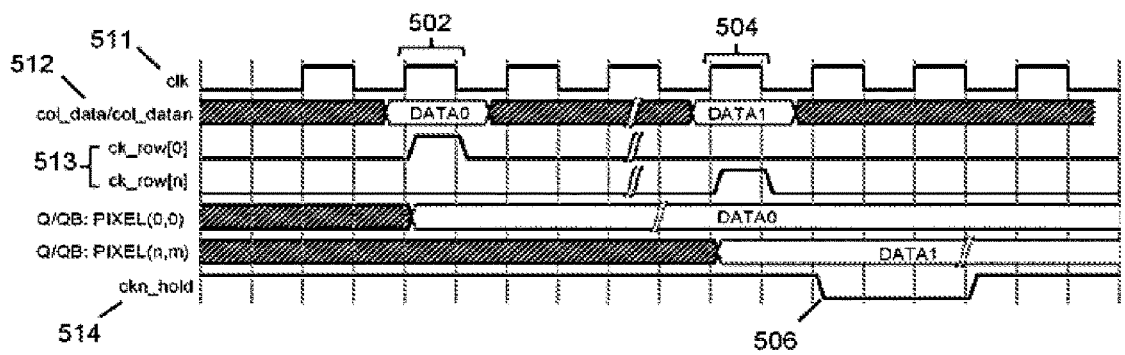
FIG. 5 illustrating timing diagrams of pixel addressing and holding in accordance with an embodiment of the invention.

FIG. 5 illustrates an exemplary timing diagram that may be applied to the ports of digital pixel circuit 200 to control the addressing and illumination (holding) of the respective pixels in the pixel array. The first row 511 of the timing diagram illustrates the system clock timing diagram, the second row 512 illustrates the timing diagram of the inputs provided to the pixel, i.e. col_data and col_datan, and the third group of rows 513 illustrates the timing diagrams of the various rows of enable clock of ck_row[n], where n is the n$^{th}$ row and it can be seen that from the first row to the next row, the ck_row is shifted by one system clock cycle. It can also be seen that when ck_row [0] is toggled to a high voltage level, the values stored in Q and $Q_B$ nodes of the SRAM circuit will be updated based on the data from the col_data and col_datan input ports. Once all the pixels in row[n] have been updated, the whole pixel array's addressing step has been completed as such, ckn_hold's falling edge appears and this enables the hold buffer circuit in all the digital pixel circuits thereby illuminating the pixel array with the content from the SRAM circuits. The flashing (holding) duration of the pixels depends on the length of the variable holding time component of the bit-plane signal, which increases from $2^0T_U$ to $2^{15}T_U$.

One skilled in the art will recognize that the bit-plane signals generated in FIGS. 3 and 4 may be provided as the signals to the ck_row input port and ckn_hold input port of the digital pixel circuit whereby the variable holding time component is applied to the ckn_hold input port and the predetermined addressing time component is applied to the ck_row input port thereby generating the exemplary timing diagrams shown in FIG. 5.

Figure 6:
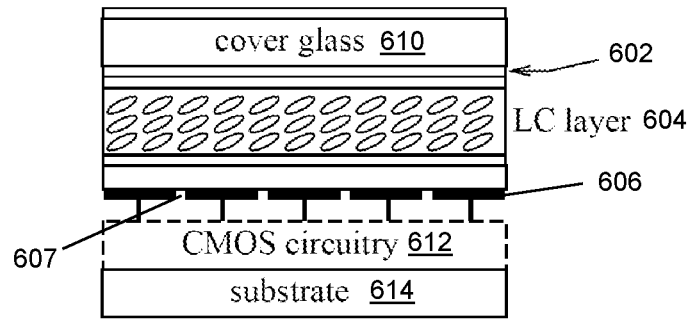
FIG. 6 illustrating a side cut-out view of a pixel array in accordance with embodiments of the invention.

A side view of a pixel array is illustrated in FIG. 6. In particular, a pixel array comprises CMOS circuitry 612 that is fabricated on top of substrate 614. Connecting bonds/wires are then used to connect the CMOS circuitry to electrodes 606 whereby the electrodes are separated from one another by via holes 607. Liquid crystal layer 604 is then provided between electrodes 606 and indium tin oxide (ITO) electrodes 602. A layer of glass 610 is then used to cover the surface of the ITO electrodes 602. In other words, it can be said that a pixel comprises a liquid crystal layer 604 that is provided between one of electrodes 606 and one of ITO electrodes 602.

As mentioned in the earlier sections, field inversion is implemented at the liquid crystal layer 604 (this is also known as DC balancing), and this is done to prevent the unidirectional flow of ions in the liquid crystal layer. In accordance with embodiments of the invention, this may be achieved by reversing a voltage level that is applied to ITO electrodes 602 every sub-frame. In other words, the voltage provided at ITO electrodes 602, $V_{ITO}$ may be configured to toggle between GND voltage level and a higher $V_{DDA}$ voltage level to maximize the voltage difference across the liquid crystal layer.

Figure 7:
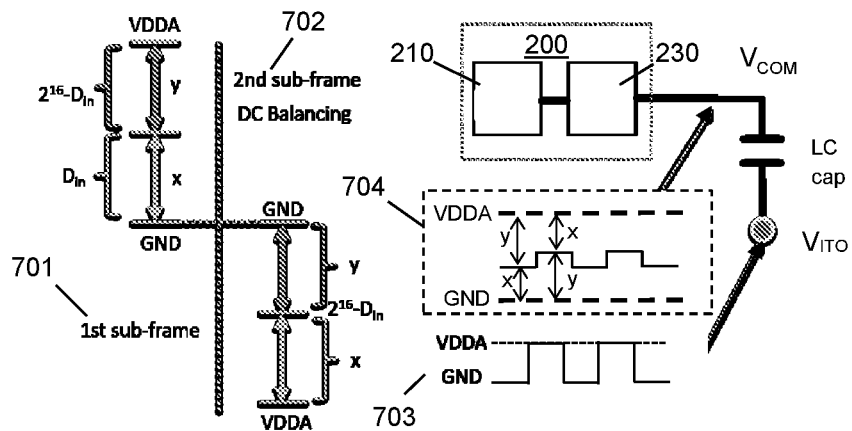
FIG. 7 illustrating a timing diagram of a voltage driver in accordance with embodiments of the invention.
Figure 8:
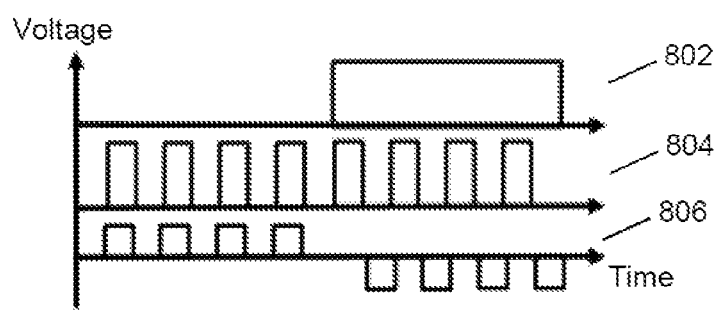
FIG. 8 illustrating a timing diagram of a voltage driver when the voltage driver is synchronized with the system clock of the modulator in accordance with embodiments of the invention.

This is illustrated in FIG. 7 whereby in the first sub-frame 701, the ITO electrode is connected to GND and as a result, the voltage at the ITO electrodes, $V_{ITO}$ is at the GND voltage level. Under the assumption that the final RMS voltage after all the bit-plane's addressing has been completed by digital code $D_{in}$ is x, the voltage x is the voltage difference between electrode 606 and ITO electrode 602 of the liquid crystal layer (i.e. electrode 606: x volts, ITO electrode 602: GND voltage level).

In the second sub-frame, 702 the applied digital signal becomes $2^{16}-D_{in}$ (under the assumption that the full scale $V_{DDA}$ is in relation to $2^{16}$ in the digital domain). As the voltage difference between $2^{16}-D_{in}$ and $V_{DDA}$ is still x, a negative x is realized (electrode 606: y volts, ITO electrode 602: $V_{DDA}$ voltS, whereby the difference between the two electrodes is $y-V_{DDA}=2^{16}-D_{in}-2^{16}=-x$). The behaviour of the sub-frames 703 and 704 are also illustrated in FIG. 7 with the variation in voltage levels for electrode 606 being shown as sub-frame 704 and the variation in voltage levels for ITO electrode 602 being shown as sub-frame 703.

In embodiments of the invention, the toggling of the voltage at electrode 606, $V_{COM}$, may be synchronized with the toggling of the voltage at ITO electrode 602, $V_{ITO}$ (from GND to $V_{DDA}$) and this may be done by generating the voltage provided to ITO electrode 602, $V_{ITO}$ using the bit-plane control circuit.

Verification Results

As an exemplary embodiment of the invention, the design as illustrated in the drawings and as described in the sections above was fabricated using a CMOS process and the results obtained from the SLM system 100 was compared against SLM systems known in the art as shown in Table 1 below.

TABLE 1

| | SLM 100 | Prior Art 1 | Prior Art 2 | Prior Art 3 | Prior Art 4 | Prior Art 5 | Prior Art 6 |
|---|---|---|---|---|---|---|---|
| Display format | 1280 × 720 | 1920 × 1080 | 1920 × 1080 | 1280 × 720 | 4160 × 2464 | 4096 × 2400 | 1920 × 1080 |
| Panel size | 0.058 inch | 0.55 inch | 0.26 inch | 0.26 inch | 0.7 inch | 0.7 inch | 0.55 inch |
| Pixel pitch | 1 um | 6.4 um | 3 um | 4.5 um | 3.74 um | 3.74 um | 6.4 um |
| Fill factor | 76.8% | 98.4% | 93.50% | 92% | 90% | 90% | 93% |
| resolution | 8 bits | 8 bits | 1080p~4K | 8 bits | 8 bits | 8 bits | 8 bits |
| Frame rate | 60 Hz | 60 Hz | 60 Hz | 60 Hz RGB/180 Hz monochrome | 58 Hz | 30 Hz | 60 Hz |
| Phase retardation | 2π | 2.75π@30 2.31π@45 | 2π | 2π | >2π | 2π | 2π |
| FOM | 2.943E−9 | 4.18214E−08 | 9.67085E−09 | 4.97569E−08 | 3.26775E−09 | 6.58746E−09 | 4.42497E−08 |

FOR PHASE RETARDATION OF 2π:

$$FOM = \frac{pitch^2}{format \times FF \times frame_{rate} \times resolution}$$

It can be seen that although the panel size of SLM 100 was the smallest amongst all the SLM systems, SLM 100 did not sacrifice its display format, resolution, and frame rate.

The above is a description of embodiments of a circuit and method in accordance with the present invention as set forth in the following claims. It is envisioned that others may and will design alternatives that fall within the scope of the following claims.

The invention claimed is:

1. A spatial light modulator comprising:
a pixel array having a plurality of pixels whereby each pixel is communicatively connected to a digital pixel circuit whereby each digital pixel circuit comprises:
a Static Random Access Memory (SRAM) circuit configured to receive column data signals and a clock row enable signal, ck_row, whereby the SRAM circuit is triggered by the clock row enable signal, ck_row, to sample the received column data signals;
a hold buffer circuit coupled to an output of the SRAM circuit, the hold buffer circuit configured to receive a clock hold signal, ck_hold, whereby the hold buffer circuit is triggered by the clock hold signal, ck_hold, to receive and store the sampled signal from the output of the SRAM circuit.

2. The spatial light modulator according to claim 1 further comprising:
a bit-plane control circuit communicatively connected to all the digital pixel circuits, the bit-plane control circuit being configured to:
generate, using a pulse code modulation (PCM) scheme, bit-plane signals,
whereby each bit-plane signal comprises a variable holding time component for triggering the hold buffer circuit in each of the digital pixel circuits for a variable time period $T_{Hold\_N}$, and a predetermined addressing time component for triggering the SRAM circuit in each of the digital pixel circuits for a predetermined time period $T_{Add}$.

3. The spatial light modulator according to claim 2 whereby the addressing time component is predetermined based on a unit duration of a Least Significant Bit (LSB) of a bit-plane signal and a pixel multiplier, $\alpha_P$ wherein the pixel multiplier, $\alpha_P$ is based on numbers of rows and columns, and data input-output ports of the pixel array.

4. The spatial light modulator according to claim 3 whereby the pixel multiplier, $\alpha_P$, is defined as $$\alpha_p = \frac{(\text{Number of rows}) \times (\text{Number of columns})}{(\text{Number of data input/output ports})}$$

5. The spatial light modulator according to claim 1 whereby each pixel in the pixel array comprises a liquid crystal layer provided between an indium tin oxide (ITO) electrode and a pixel electrode, whereby the ITO electrode is configured to receive an alternating voltage and the pixel electrode is connected to an output of the digital pixel circuit.

6. The spatial light modulator according to claim 2 whereby each pixel in the pixel array comprises a liquid crystal layer provided between an indium tin oxide (ITO) electrode and a pixel electrode, whereby the pixel electrode is connected to an output of the digital pixel circuit and the ITO electrode is configured to receive an alternating voltage from the bit-plane control circuit, whereby the alternating voltage is synchronized with an output signal at the output of the digital pixel circuit.

7. The spatial light modulator according to claim 1 whereby the hold buffer circuit comprises:
a first and a third transistor having input gates coupled to the output of the SRAM circuit;
a second and a fourth transistor having input gates configured to receive a clock hold signal, ck_hold,
whereby a drain node of the second transistor is coupled to a source node of the first and third transistors.

8. The spatial light modulator according to claim 7 whereby a transistor of the hold buffer circuit is shared between two or more digital pixel circuits.

9. A method for modulating spatial light using a spatial light modulator that has a pixel array which comprises a plurality of pixels whereby each pixel is communicatively connected to a digital pixel circuit, the method comprising:
receiving, using a Static Random Access Memory (SRAM) circuit provided within each digital pixel circuit, column data signals and a clock row enable signal, ck_row, whereby the SRAM circuit is triggered by the clock row enable signal, ck_row, to sample the received column data signals;
receiving, using a hold buffer circuit coupled to an output of the SRAM circuit, a clock hold signal, ck_hold, whereby the hold buffer circuit is triggered by the clock hold signal, ck_hold, to receive and store the sampled signal from the output of the SRAM circuit.

10. The method according to claim 9 further comprising:
generating, using a bit-plane control circuit communicatively connected to all the digital pixel circuits, bit-plane signals based on a pulse code modulation (PCM) scheme,
whereby each bit-plane signal comprises a variable holding time component for triggering the hold buffer circuit in each of the digital pixel circuits for a variable time period $T_{Hold\_N}$, and a predetermined addressing time component for triggering the SRAM circuit in each of the digital pixel circuits for a predetermined time period $T_{Add}$.

11. The method according to claim 10 whereby the addressing time component is predetermined based on a unit duration of a Least Significant Bit (LSB) of a bit-plane signal and a pixel multiplier, $\alpha_P$ wherein the pixel multiplier, $\alpha_P$ is based on numbers of rows and columns, and data input-output ports of the pixel array.

12. The method according to claim 11 whereby the pixel multiplier, $\alpha_P$, is defined as $$\alpha_p = \frac{(\text{Number of rows}) \times (\text{Number of columns})}{(\text{Number of data input/output ports})}$$

13. The method according to claim 9 whereby each pixel in the pixel array comprises a liquid crystal layer provided between an indium tin oxide (ITO) electrode and a pixel electrode, whereby the ITO electrode is configured to receive an alternating voltage and the pixel electrode is connected to an output of the digital pixel circuit.

14. The method according to claim 10 whereby each pixel in the pixel array comprises a liquid crystal layer provided between an indium tin oxide (ITO) electrode and a pixel electrode, whereby the pixel electrode is connected to an output of the digital pixel circuit and the ITO electrode is configured to receive an alternating voltage from the bit-plane control circuit, whereby the alternating voltage is synchronized with an output signal at the output of the digital pixel circuit.

15. The method according to claim 9 whereby the hold buffer circuit comprises:
a first and a third transistor having input gates coupled to the output of the SRAM circuit;
a second and a fourth transistor having input gates configured to receive a clock hold signal, ck_hold,
whereby a drain node of the second transistor is coupled to a source node of the first and third transistors.

16. The method according to claim 15 whereby a transistor of the hold buffer circuit is shared between two or more digital pixel circuits.

* * * * *